US006876021B2

(12) United States Patent
Martin et al.

(10) Patent No.: US 6,876,021 B2
(45) Date of Patent: Apr. 5, 2005

(54) USE OF AMORPHOUS ALUMINUM OXIDE ON A CAPACITOR SIDEWALL FOR USE AS A HYDROGEN BARRIER

(75) Inventors: J. Scott Martin, Garland, TX (US); Scott R. Summerfelt, Garland, TX (US); Theodore S. Moise, Dallas, TX (US); Kelly J. Taylor, Allen, TX (US); Luigi Colombo, Dallas, TX (US); Sanjeev Aggarwal, Plano, TX (US); Sirisha Kuchimanchi, Dallas, TX (US); K. R. Udayakumar, Dallas, TX (US); Lindsey Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 210 days.

(21) Appl. No.: 10/303,560

(22) Filed: Nov. 25, 2002

(65) Prior Publication Data

US 2004/0099893 A1 May 27, 2004

(51) Int. Cl.[7] .............................................. H01L 31/119
(52) U.S. Cl. ....................... 257/295; 257/296
(58) Field of Search ................................ 257/295, 310, 257/306, 629; 365/100; 361/303; 438/240, 3

(56) References Cited

U.S. PATENT DOCUMENTS

| | | | | |
|---|---|---|---|---|
| 5,452,178 | A | * | 9/1995 | Emesh et al. ................ 361/303 |
| 5,972,722 | A | | 10/1999 | Visokay et al. |
| 6,090,697 | A | | 7/2000 | Xing et al. |
| 6,144,060 | A | | 11/2000 | Park et al. |
| 6,177,351 | B1 | | 1/2001 | Beratan et al. |
| 6,225,656 | B1 | | 5/2001 | Cuchiaro et al. |
| 6,242,299 | B1 | * | 6/2001 | Hickert ........................ 438/240 |
| 6,261,967 | B1 | | 7/2001 | Athavale et al. |
| 6,291,251 | B1 | | 9/2001 | Nam |
| 6,423,592 | B1 | | 7/2002 | Sun |
| 6,495,413 | B2 | | 12/2002 | Sun et al. |
| 6,528,386 | B1 | | 3/2003 | Summerfelt et al. |
| 6,534,809 | B2 | | 3/2003 | Moise et al. |
| 6,576,482 | B1 | | 6/2003 | Aggarwal et al. |
| 6,611,014 | B1 | * | 8/2003 | Kanaya et al. ............... 257/295 |
| 2001/0034108 | A1 | | 10/2001 | Moise et al. |
| 2001/0044205 | A1 | | 11/2001 | Gilbert et al. |

OTHER PUBLICATIONS

"FeRAM Tutorial", Ali Sheikholeslami and P. Glenn Gulak, A survey of circuit Innovations in Ferroelectric random–access memories, Proceedings of the IEEE, vol. 88, No. 3, May, 2000, 3 pages, taken from the Internet at: http://www.eecg.toronto.edu/–ali/ferro/tutorial.html.

"A survey of Circuit Innovations in Ferroelectric Random Access Memories", Ali Sheikholeslami and P. Glenn, Proceedings of the IEEE, vol. 88, No. 5, May, 2000, pp. 667–689.

"Generic CVD Reactor", CVD Basics, Daniel M. Dobkin, Dec. 7, 2001, 3 pages, taken from the Internet at: http://www.batnet.com/enigmatics/semiconductor_processing/CVD_Fundamentals/Introdu . . . .

"Physical Vapor D position", Cougar Labs, Inc., Dec. 7, 2001, 9 pages, taken from the internet at: http://www.cougarlabs.com/pvd1.html.

(Continued)

*Primary Examiner*—David Nelms
*Assistant Examiner*—Thinh T Nguyen
(74) *Attorney, Agent, or Firm*—Jacqueline J. Garner; W. James Brady, III; Frederick J. Telecky, Jr.

(57) ABSTRACT

The present invention forms sidewall diffusion barrier layer (s) that mitigate hydrogen contamination of ferroelectric capacitors. Sidewall diffusion barrier layer(s) of the present invention are formed via a physical vapor deposition process at a low temperature. By so doing, the sidewall diffusion barrier layer(s) are substantially amorphous and provide superior protection against hydrogen diffusion than conventional and/or crystalline sidewall diffusion barrier layers.

17 Claims, 11 Drawing Sheets

OTHER PUBLICATIONS

"Parasitic Channel Induced by Spin–On–Glass In a Double–Level Metallizaiton Complimentary Metal Oxide Semiconductor Process", M. Murata, K. Yomauchi, H. Kojima, A. Yokoyama, T. Inoue and T. Iwamori, published in the Journal of Electrochemical Society, vol. 149, No. 8, 1993, pp. 2346–2356.

"Effects of Oxygen Content on Properties of Silicon Oxide Films Prepared at Room Temperature by Sputtering–Type Electron Cyclotron Resonance Plasma", Katsuhiko Furukawa, Yichun Liu, Hiroshi Nakashima, Dawei Gao, Yasuhiro Kashiwazaki, Kiichiro Uchino, Katsunori Muraoka and Hirohisa Tsuzuki, Journal of Applied Physics, vol. 84, No. 8, Oct. 15, 1998, pp. 4579–4584.

Notes taken at the International Symposium on Applications of Ferroelectrics Conference in Nara, Japan in May, 2002. The speaker was H. Nagel of Infineon Technologies and Toshiba Corporation, Key Technologies for High Density FeRAM Application, one page.

"The Hydrogen Content of Plasma–Deposited silicon Nitride", W. A. Lanford and M. J. Rand, American Institute of Physics, J. Appl. Phys. 49(4), Apr. 1978, pp. 2473–2477.

"Free Energy Model for the Analysis of Bonding in $a$–$Si_x$–$N_yH_z$ Alloys", Z. Yin and W. Smith, J. Vac. Sci. Technol. A. vol. 9, No. 3, MayJun. 1991, p. 972.

"Comparison Between HCP CVD and PECVD Silicon Nitride for Advanced Interconnect Applications", J. Yota, M. Janani, L.E. Camilletti, A. Kar–Roy, Q.Z. Liu, C. Nguyen, M.D. Woo J. Hander, and P. Van Cleemput, IEEE, pp. 76–78.

"Hydrogen Role on the Properties of Amorphous Silicon Nitride", F. De Brito Mots, J.F. Justo and A. Fazzio, Journal of Applied Physics, vol. 86, No. 4, Aug. 15, 1999, pp. 1843–1847.

* cited by examiner

USE OF AMORPHOUS ALUMINUM OXIDE ON A CAPACITOR SIDEWALL FOR USE AS A HYDROGEN BARRIER

FIELD OF THE INVENTION

The present invention relates generally to the field of integrated circuit processing, and more particularly relates to an FRAM structure and a method of manufacture thereof having an amorphous sidewall barrier layer that mitigates undesired diffusion and/or contamination.

BACKGROUND OF THE INVENTION

Several trends exist, today, in the semiconductor device fabrication industry and the electronics industry. Devices are continuously getting smaller and smaller and requiring less and less power. A reason for this is that more personal devices are being fabricated which are very small and portable, thereby relying on a small battery as its supply source. For example, cellular phones, personal computing devices, and personal sound systems, personal digital assistants, and the like are devices that are in great demand in the consumer market. In addition to being smaller and more portable, personal devices are requiring more computational power and on-chip memory. In light of all these trends, there is a need in the industry to provide a computational device that has a fair amount of memory and logic functions integrated onto the same semiconductor chip. Preferably, this memory will be configured such that if the battery dies, the contents of the memory will be retained. Such a memory device which retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FRAM) is a non-volatile memory which utilizes a ferroelectric material as the capacitor dielectric situated between a bottom electrode and a top electrode. Both read and write operations are performed for a FRAM. The memory size and memory architecture affect the read and write access times of a FRAM. Table 1 illustrates the differences between different memory types.

TABLE 1

| Property | SRAM | Flash | DRAM | FRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |

TABLE 1-continued

| Property | SRAM | Flash | DRAM | FRAM (Demo) |
|---|---|---|---|---|
| Architecture | NDRO | NDRO | DRO | DRO |
| Non volatile | NO | YES | NO | YES |
| Storage | I | Q | Q | P |

The non-volatility of an FRAM is due to the bi-stable characteristic of the ferroelectric memory cell. Two types of memory cells are typically used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL) (e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. The one difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bit line-bar 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar 34, respectively. A differential signal (not shown) is thus generated across the bit line 32 and the bit line-bar 34 by the dual capacitor memory cell 30. The differential signal is sensed by a sense amplifier (not shown) that provides a signal corresponding to the logic level stored in memory.

As stated above, a ferroelectric capacitor includes a ferroelectric layer as a dielectric material sandwiched between a bottom electrode and a top electrode. The various read/write operations described supra utilize the ferroelectric properties, polarization, of the ferroelectric layer. However, contaminants can modify or destroy the desired ferroelectric properties of the ferroelectric layer. Contaminants can be introduced in a variety of ways, such as by subsequent processing steps.

One particularly destructive contaminant is hydrogen, which if it encounters the ferroelectric capacitor can alter or degrade the desired ferroelectric properties such that the ferroelectric capacitor is unusable. Hydrogen can cause the ferroelectric layer to lose a percentage of its polarization ability therein possibly rendering the ferroelectric capacitor unusable. Unfortunately, hydrogen is widely utilized in a variety of semiconductor fabrication processes, and is not able to be easily removed from such processes.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In essence, the instant invention relates to the fabrication of an FRAM device, which is either a stand-alone device or one which is integrated onto a semiconductor chip which includes many other device types.

The present invention relates to mitigating hydrogen diffusion into a ferroelectric capacitor. Contamination of the ferroelectric capacitor, specifically the ferroelectric dielectric, can significantly degrade and/or damage the ferroelectric capacitor. Thus, the present invention includes systems and methods for forming of sidewall diffusion barrier layer(s) that mitigate hydrogen contamination of ferroelectric capacitors. Generally, sidewall diffusion barrier layer(s) of the present invention are formed via a physical vapor deposition process at a low temperature. By so doing, the sidewall diffusion barrier layer(s) become substantially amorphous and provide superior protection against hydrogen diffusion than conventional sidewall diffusion barrier layers.

In one aspect of the present invention, a ferroelectric device is disclosed. The ferroelectric device includes a ferroelectric capacitor and a sidewall diffusion barrier layer. The ferroelectric capacitor comprises a bottom electrode, a ferroelectric layer formed on the bottom electrode, and a top electrode formed on the ferroelectric layer. The sidewall diffusion barrier layer is formed at least on sidewalls of the ferroelectric capacitor and comprises amorphous aluminum oxide.

In accordance with another aspect of the invention, a method of forming a ferroelectric device is disclosed. A bottom electrode is formed and can be formed over a substrate and/or an active device. A ferroelectric layer (e.g., dielectric layer) is formed on the bottom electrode and a top electrode comprised of one or more individual layers is formed on the ferroelectric layer. The bottom electrode, the ferroelectric layer and the top electrode are selectively etched to define a capacitor stack. A low temperature physical vapor deposition process is performed to form an amorphous sidewall diffusion barrier layer along sidewalls of the capacitor stack.

In yet another aspect of the present invention, a method of selecting sidewall diffusion barrier processing parameters is disclosed. A plurality of sidewall diffusion barrier processing parameters for a plurality of ferroelectric capacitors are selected and a plurality of sidewall diffusion barrier layers are formed on the plurality of ferroelectric capacitors, respectively, via a low temperature physical vapor deposition process according to the plurality of sidewall processing parameters. The plurality of ferroelectric capacitors are subjected to hydrogen contamination and performance parameters such as polarization retention for the plurality of ferroelectric capacitors are evaluated. One or more processing parameters of the plurality of sidewall processing parameters are selected that result in acceptable and/or improved performance.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. While the following description of the instant invention revolves around the integration of the FRAM devices with logic devices and other devices which can be found on a digital signal processor, microprocessor, smart card, microcomputer, microcontroller or system on a chip, the instant invention can be used to fabricate stand-alone FRAM devices or FRAM devices integrated into a semiconductor chip which has many other device types. In particular, the improved performance of the FRAM device of the instant invention compared to standard semiconductor memories appears to make FRAM the memory of choice for many handheld devices which require low power and a large degree of device integration.

The figures provided herewith and the accompanying description of the figures are merely provided for illustrative purposes. One of ordinary skill in the art should realize, based on the instant description, other implementations and methods for fabricating the devices and structures illustrated in the figures and in the following description. For example, while shallow trench isolation structures ("STI") are illustrated, any conventional isolation structures may be used, such as field oxidation regions (also known as LOCOS regions) or implanted regions. In addition, while a structure 302 is preferably a single-crystal silicon substrate which is doped to be n-type or p-type, structure 302 (FIG. 3) may be formed by fabricating an epitaxial silicon layer on a single-crystal silicon substrate.

Figure 1:
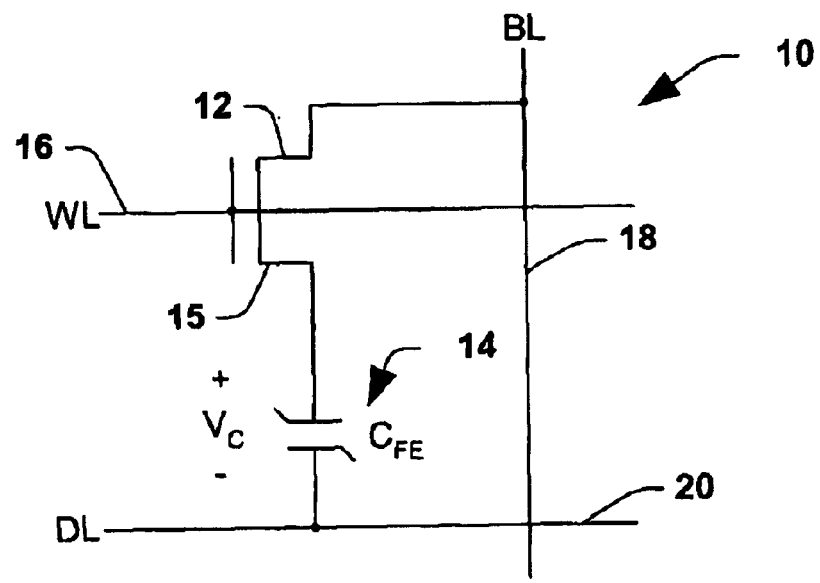
FIG. 1 is a prior art schematic diagram illustrating an exemplary 1T/1C FRAM memory cell.
Figure 2:
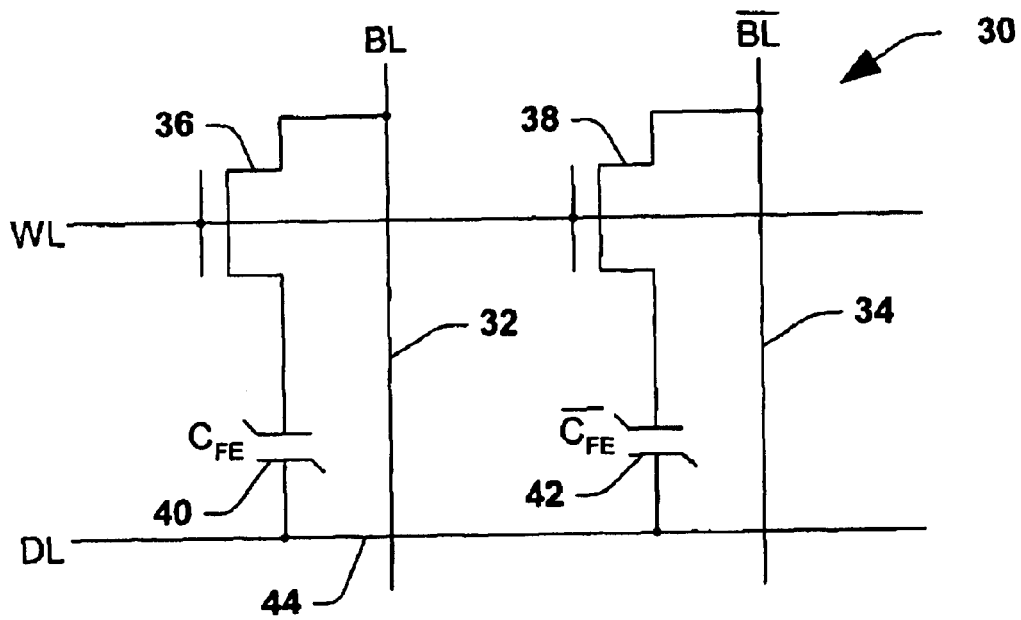
FIG. 2 is a prior schematic diagram illustrating an exemplary 2T/2C FRAM memory cell.
Figure 3:
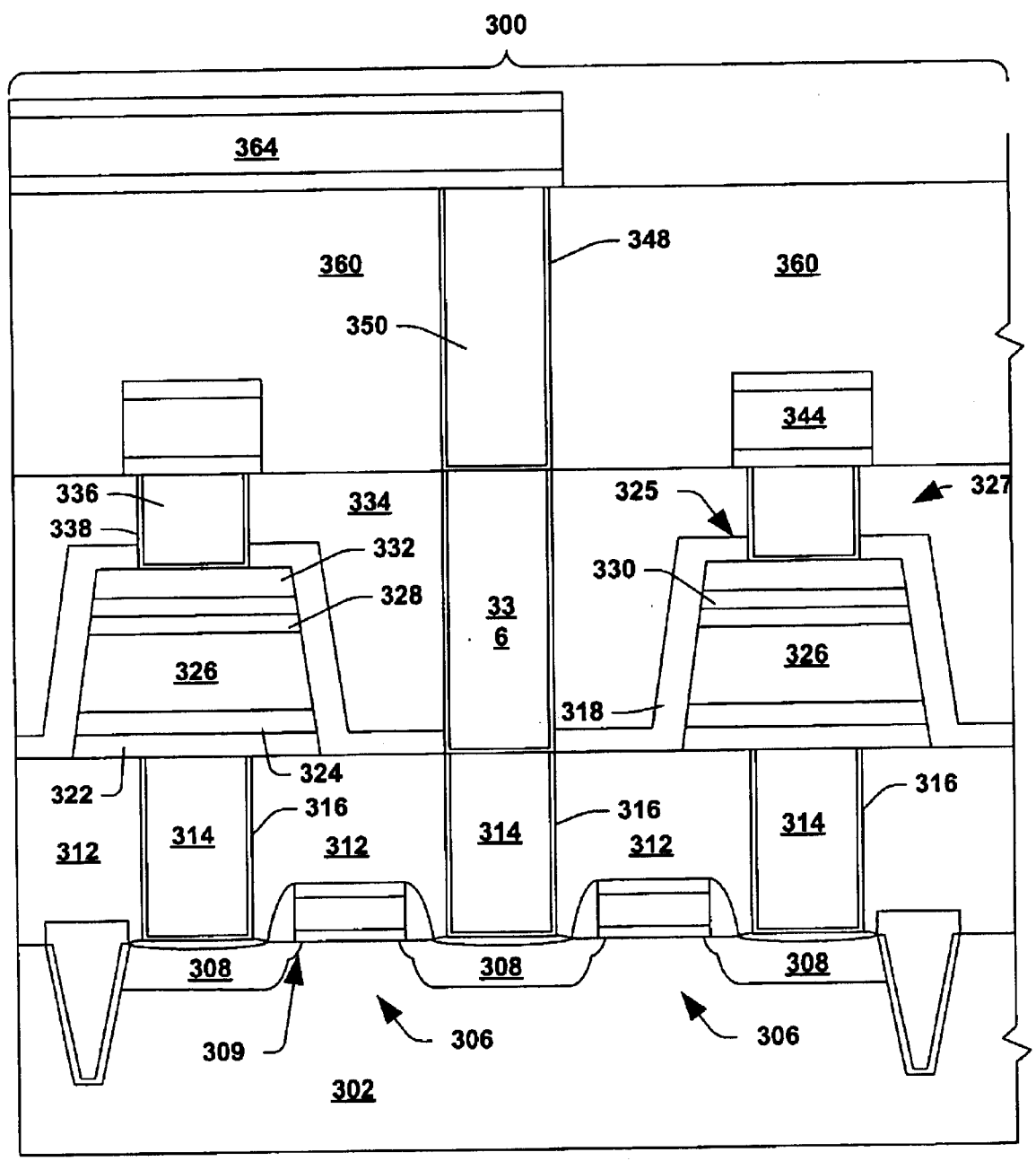
FIG. 3 is a cross section of a semiconductor device in accordance with an aspect of the present invention.

Referring initially to FIG. 3, a cross section of a semiconductor device 300 is illustrated. The device 300 represents a partially fabricated version of an FRAM cell in accordance with the present invention.

Gate structures 306 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 306 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 308 may be formed via, for example, implantation using conventional dopants and processing conditions. Lightly doped drain extensions 309 as well as pocket implants may also be utilized. In addition, the source/drain regions 308 may be silicided (for example, with titanium, cobalt, nickel, tungsten or other conventional silicide material).

A dielectric layer 312 is formed over the entire substrate 302 and is patterned and etched so as to form openings for contacts to the substrate and gate structures 306 to be formed. These openings are filled subsequently with one or more conductive materials, such as a plug 314 (for example, comprising a metal such as tungsten, molybdenum, titanium, titanium nitride, tantalum nitride, or a metal silicide such as Ti, Ni or Co, copper or doped polysilicon). A liner/barrier layer 316 may or may not be formed between the plug 314 and dielectric 312. Such a liner/barrier layer 316 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 312 comprises, for example, $SiO_2$ (doped or undoped with dopants such as boron or phosphorous) possibly with a layer of hydrogen or deuterium containing silicon nitride next to the gate. After deposition of the diffusion barrier 316 it is likely that the barrier will be planarized for improved lithography of overlying layers using a process such as chemical mechanical polishing (CMP). In addition, an added diffusion barrier/etch stop (not shown) may be included near the top surface of layer 312 such as $AlO_x$, AlN, $Si_3N_4$, $TiO_2$, $ZrO_2$, or $TaO_x$ that would be deposited after the planarization process. This diffusion barrier is particularly useful if damascene processes are used to create the via or metallization to the contact. The formation of the plug 314 will require etching through this optional barrier/etch stop.

Formation of metal structures which are situated above the contacts is considered to be part of the back end processes. Other than the specific FRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 312, 334 and 360). If formed, this thin dielectric comprises, for example, silicon nitride, silicon carbide, SiCNO or a silicon oxide (for example, a high-density plasma oxide). In addition, interlevel dielectric layers 312, 334, and 360 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 336 and 350 and conductors 344 and 364 comprise a metal material (for example, copper, aluminum, titanium, TiN, tungsten, tungsten nitride, or any combination or stack thereof. A barrier/liner may be formed between the plug and the respective interlevel dielectric layer. If formed, the barrier/liner layer (shown as layers 338 and 348 and liners 342, 346, 362 and 366) comprises, for example, Ti, TiN, W, tungsten nitride, Ta, tantalum nitride, any conventional barrier/liner layer, or any combination or stack thereof). The interlayer dielectric and plug material should be compatible with the FRAM thermal budget. With existing technology (i.e., one that incorporates a W plug and $SiO_2$ ILD), the FRAM thermal budget should be less than approximately 600 or 650 C, however, the present invention is not limited thereto. If the ILD is modified to include a low dielectric constant ("low K") layer, the FRAM thermal budget may need to be reduced further. The preferred interlayer dielectric 312 is therefore a material that can withstand a thermal budget in excess of 600 C, such as silicon oxide (doped and/or undoped), silicon nitride, and/or silicon oxy-nitride.

Level 327 is added so as to accommodate the FRAM cells (FRAM process module). This FRAM process module allows the creation of ferroelectric or high dielectric constant capacitors to be easily added with maximum thermal budget for the new process module yet not impact the thermal budget of backend process. In particular, this level allows FRAM devices with capacitor under bit line configuration compatible with a high-density memory. However, it is possible, if planarity is not a necessity, to form the FRAM devices while not forming layer 327 in region 305.

Initially, a further discussion of FIG. 3 will be provided to appreciate the structure of an FRAM cell and an exemplary integration position of such a cell within a semiconductor fabrication process. Subsequently, a flow chart and a number of fragmentary cross section diagrams will be provided to illustrate an exemplary process for fabricating such an FRAM cell in order to provide a context in which the present invention may reside. In conjunction therewith, the present invention will be described and illustrated in greater detail. It should be understood, however, that although the present invention will be shown and described in conjunction with one exemplary context, the invention is applicable to other fabrication methodologies, structures and materials, and such alternatives are contemplated as falling within the scope of the present invention.

An FRAM capacitor, as illustrated in FIG. 3 at reference numeral 325, resides above the interlayer dielectric 312, and comprises several layers. The FRAM capacitor 325 of FIG. 3 comprises an electrically conductive barrier layer 322 upon which a conductive bottom capacitor electrode 324 resides (hereinafter, the terms conductive and insulative are employed to indicate electrically conductive and electrically insulative, respectively, unless indicated otherwise). A capacitor dielectric layer 326, a ferroelectric material, is formed over the bottom electrode 324, and is covered by, for example, a conductive multi-layer top electrode 328, 330. A top portion of the FRAM capacitor 325 comprises a hard mask layer 332 which, may be employed to facilitate the capacitor stack etch.

The capacitor stack is covered and/or encapsulated by a sidewall diffusion barrier layer 318. According to the present invention, the sidewall diffusion barrier layer 318 is comprised of amorphous aluminum oxide $AlO_x$. The sidewall diffusion barrier layer 318 is formed via a low temperature physical vapor deposition (PVD) process. The low temperature is at or below about 200° C. and is identifiable as being amorphous via a transmission electron microscope (TEM). Standard scanning electron microscopes (SEMs) typically have a resolution range of about 20 to 30 angstroms, which may not be small enough to detect amorphousness of the sidewall diffusion barrier layer 318. In contrast, the TEM passes an electron beam through a thin sample, which increases the resolution to about 2 angstroms. Thus, the TEM can be employed to detect amorphous and crystalline properties of the sidewall diffusion barrier layer 318 by identifying crystalline features. The inventors of the present invention appreciate that other mechanisms can be employed in accordance of the present invention to identify amorphous properties of the sidewall diffusion barrier layer 318.

Figure 4:
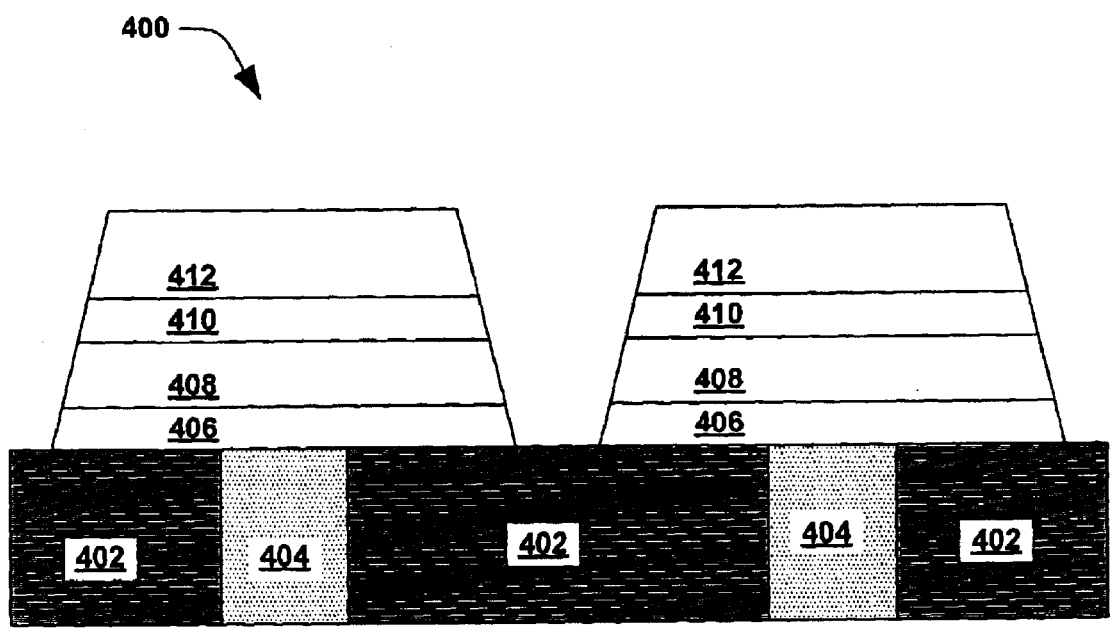
FIG. 4 is a cross section of two capacitor stacks in accordance with an aspect of the present invention.

Continuing with FIG. 4, a cross section of two capacitor stacks 400 in accordance with an aspect of the present invention are depicted. Generally, the capacitor stacks 400 are formed on/over a semiconductor device that has completed front end processing. As discussed supra, formation of the capacitor stacks 400 is part of the back end processing.

An interlevel dielectric layer (ILD) 402 is formed on/over a semiconductor device (not shown), such as a transistor (e.g., see FIG. 3 for an exemplary structure), which may serve as an access transistor. The interlevel dielectric layer may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof. Plugs 404 are formed in the interlevel dielectric layer 402 by etching holes and filling with a conductive material, such as tungsten, molybdenum, titanium, titanium nitride, tantalum nitride, or a metal silicide such as Ti, Ni or Co, copper or doped polysilicon. The plugs 404 provide an electrical connection from an active device below (not shown) to the capacitor stack 400.

A lower barrier layer (not shown), such as a bottom electrode diffusion barrier layer, can be formed on the plug(s) prior to formation of a bottom electrode 406. The bottom electrode diffusion barrier layer prevents or mitigates diffusion of contaminants into the capacitor stack. Additionally, the bottom electrode diffusion barrier layer is relatively thin and is at least somewhat conductive such that it does not substantially affect or interfere with current flow. The lower barrier layer, if present, can be formed via a suitable deposition process, such as physical vapor deposition, and be comprised of a material such as TiAlN, TiAlON, Ti, TiN, W, tungsten nitride, Ta, tantalum nitride, any conventional barrier/liner layer, or any combination or stack thereof.

The bottom electrode 406 is formed on/over the interlevel dielectric layer 402 and the plug(s) 404. The bottom electrode 406 can be formed such that it operates as a barrier layer in mitigating passage of contaminants such as oxygen and hydrogen (e.g., by making it thicker). The bottom electrode 406 is comprised of a suitable conductive material such as, for example, Pt, Pd, PdOx, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, $LaNiO_3$, and/or combinations thereof.

A ferroelectric dielectric layer 408, is formed over the bottom electrode 406. The ferroelectric dielectric layer 408 can be less than 150 nm thick, less than 100 nm thick, less than 50 nm thick, or another suitable thickness and is comprised of a ferroelectric material, such as $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$ etc.

PZT is a common choice for the ferroelectric dielectric layer 408 because it has the highest polarization and the lowest processing temperature of the aforementioned materials. Thin PZT (<100 nm) is extremely advantageous in making integration more simple (less material to etch) and less expensive (less material to deposit and, therefore less precursor). Because PZT has the largest switched polarization, it is also possible to minimize capacitor area using such material.

The preferred deposition technique for these dielectrics is metal organic chemical vapor deposition (MOCVD). MOCVD is preferred especially for thin films (<100 nm). MOCVD also permits the film thickness to be scaled without significant degradation of switched polarization and coercive field, yielding PZT films with a low operating voltage and large polarization values. In addition, the reliability of the MOCVD PZT film is better than that generally obtained using other deposition techniques, particularly with respect to imprint/retention.

A top electrode 410 is formed on the ferroelectric dielectric layer 408. Pb based ferroelectrics (e.g., PZT) generally should have a conductive oxide top electrode such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a noble metal in order to minimize degradation due to many opposite state write/read operations (fatigue). Many of the Bi ferroelectrics such as SBT can also use noble metal electrodes such as Pt, Pd, Au, Ag, Ir, Rh, and Ru and still retain good fatigue characteristics.

The top electrode 410 is covered with a hard mask layer 412, which facilitates patterning and formation of the capacitor stack. The hard mask layer 412 is comprised of a material resistant to developer such as silicon dioxide or a silicon rich material. Additionally, the hard mask is comprised of a suitable material so as to retain its integrity during the capacitor stack etch process. The hard mask layer 412 is fabricated so as to be thick enough to facilitate patterning of the deposited layers to form the capacitor stack 400.

Figure 5:
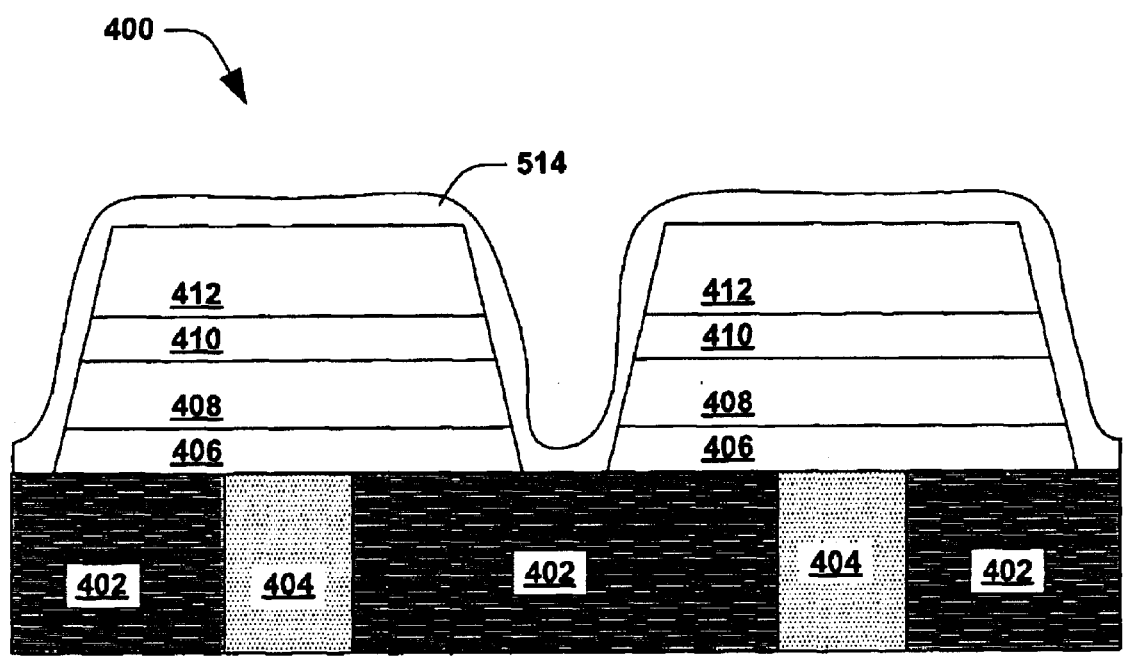
FIG. 5 is a cross section of two capacitor stacks after formation of a sidewall diffusion barrier layer in accordance with an aspect of the present invention.

FIG. 5 depicts a cross section of the capacitor stacks 400 in accordance with an aspect of the present invention. The capacitor stacks 400 are shown with a sidewall diffusion barrier layer 514 encapsulating the capacitor stacks 400. The sidewall diffusion barrier layer 514 substantially mitigates diffusion of hydrogen into the capacitor stack 400 during subsequent processing. It is also appreciated that the sidewall diffusion barrier layer 514 also mitigates diffusion of other contaminants such as oxygen.

The sidewall diffusion barrier layer 514 is comprised of amorphous aluminum oxide. The amorphousness of the sidewall diffusion barrier layer 514 can be ascertained and/or identified via a transmission electron microscope (TEM). The TEM can be employed to detect/identify presence of crystalline features within the sidewall diffusion barrier layer 514. Failure of detecting/identifying presence of substantial crystalline features, also referred to as crystallinity, via the TEM defines the layer as being amorphous. It is appreciated that other suitable mechanisms can be employed to determine whether or not the sidewall diffusion barrier layer 514 is amorphous. However, it is also appreciated that some mechanisms in certain instances (e.g., x-ray diffraction) can fail to properly define the sidewall diffusion barrier layer 514 as being amorphous. Additionally, it is appreciated that the sidewall diffusion barrier layer 514 can have a percentage of crystalline features (e.g., degrees of amorphousness) and still be sufficiently amorphous in accordance with the present invention.

The sidewall diffusion barrier layer 514 is formed by a physical vapor deposition process, typically a sputter deposition process. This sidewall diffusion barrier layer formation process is generally performed at a low temperature and includes process parameters including temperature, power settings, oxygen flow, argon flow, pressure and the like. A suitable temperature range for the physical vapor deposition process is about 180–300° C. Such temperatures mitigate or prevent the formation of crystalline features within the sidewall diffusion barrier layer 514 (i.e., are more amorphous) than similar barrier layers formed at higher temperatures. Generally, the lower the temperature the less crystalline features appear in the sidewall diffusion barrier layer 514. Thus, for example, a physical vapor deposition process performed at 180° C. may yield a sidewall diffusion barrier layer substantially free of crystalline features whereas a physical vapor deposition process performed at 300° C. may yield a sidewall diffusion barrier layer with some crystalline features The pressure employed is a low atmospheric pressure of around a few milli torr.

To perform the sputter deposition process, an aluminum source, referred to as a target, and a wafer having the capacitor stack 400 formed thereon are placed inside a vacuum chamber. The aluminum source or target is employed as a cathode and may, optionally, be biased or grounded. In one example, oxygen gas is introduced into the chamber at a determined flow rate. Argon gas is also introduced into the chamber at a determined flow rate and is ionized to a positive charge. The positively charged argon ions are attracted to the grounded or otherwise biased aluminum target and accelerate toward it. During the acceleration, the argon ions gain momentum and strike the target. At the target, a phenomenon called momentum transfer takes place wherein the argon ions "knock off" aluminum ions from the target into the chamber. The sputtered aluminum ions react with the oxygen, also present in the chamber, and come to rest on the wafer and, thereby, the capacitor stack 400 thus forming the aluminum oxide sidewall diffusion barrier layer 514.

It is appreciated that other types of deposition procedures, such as chemical vapor deposition (CVD) can be employed to possibly generate an amorphous and/or partially amorphous sidewall diffusion barrier layer. However, such procedures can require higher processing temperatures (e.g., >300° C.) and thus consume more of a thermal budget for a given semiconductor device. Further, such procedures can still fail to selectively yield an appropriate sidewall diffusion barrier layer. Additionally, commercial aluminum oxide CVD reactors and precursors are limited. Typically, commercial PVD reactors and their attendant metal targest are more widely available than CVD reactors and precursors and tend to provide superior step coverage.

It is appreciated that the capacitor stacks 400 of FIGS. 4-5 are an illustration of but one of many possible variations of devices formed in accordance with the present invention.

Figure 6:
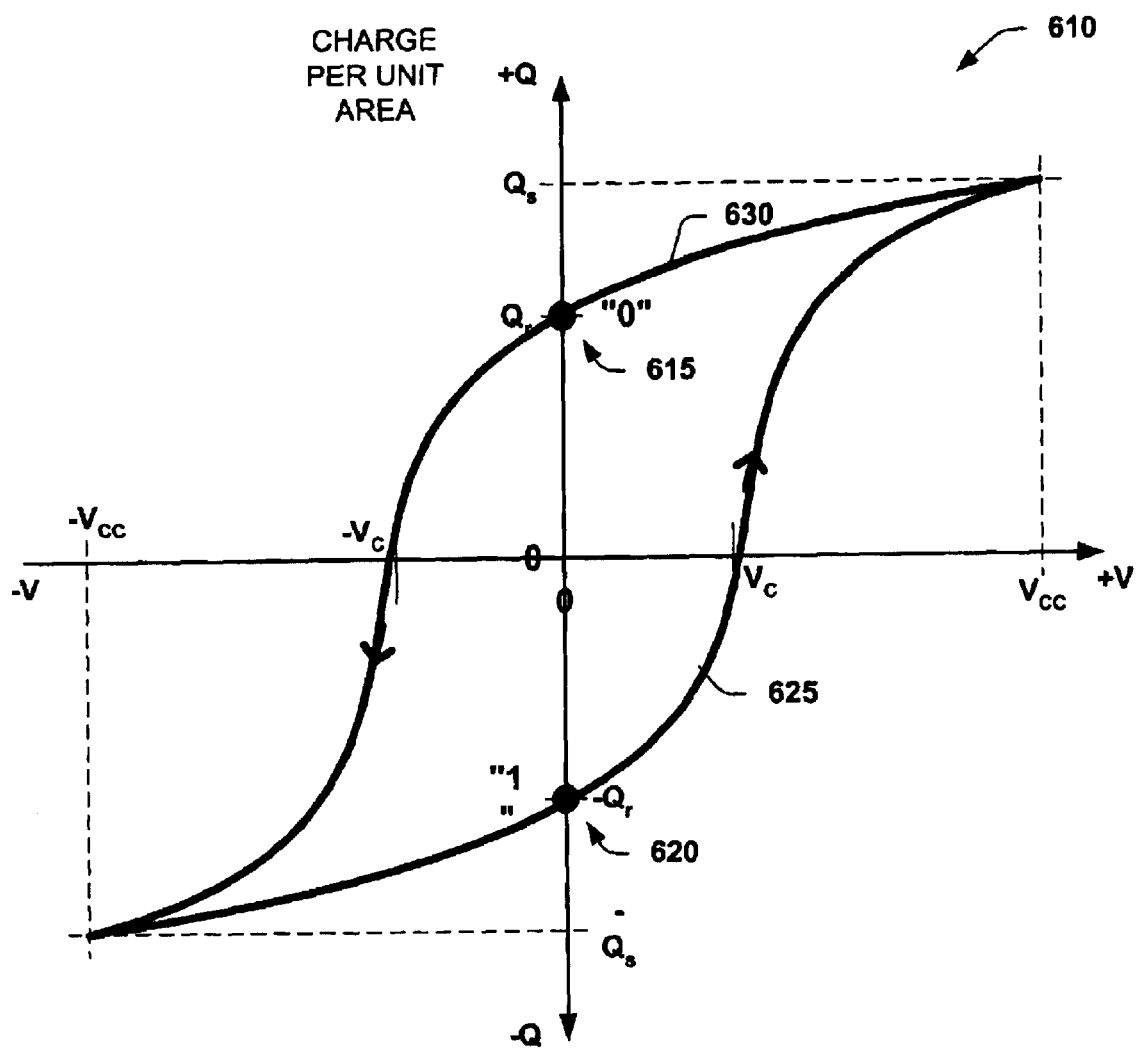
FIG. 6 is a plot of a characteristic hysteresis loop for a ferroelectric capacitor in accordance with an aspect of the present invention.

A plot 610 of the characteristic hysteresis loop for a ferroelectric capacitor in accordance with an aspect of the present invention is depicted in FIG. 6, and displays the total charge on the ferroelectric capacitor as a function of the applied voltage. Plot 610 illustrates the charge, "Q" (Y-axis), and the voltage "V" (X-axis). Remnant charge ($Q_r$), saturation charge ($Q_s$), and coercive voltage ($V_c$) are three important parameters that characterize the loop. When the voltage across the capacitor is 0V, the capacitor assumes one of the two stable states: "0" 615, or "1" 620. The total charge stored on the capacitor is $Q_r$ for a "0" 615 or $-Q_r$ for a "1" 620. A "0" can be switched to a "1" by applying a negative voltage pulse across the ferroelectric capacitor. By doing so, the total charge on the ferroelectric capacitor is reduced by $2Q_r$, a change of charge that can be sensed by the sense amplifier (amp). Similarly, a "1" can be switched back to a "0" by applying a positive voltage pulse across the capacitor, hence restoring the capacitor charge to $+Q_r$.

Characteristic curve segment 625 represents the charge path of a ferroelectric capacitor from a "1" state 620, thru $V_{cc}$ as charge is applied, and then thru curve segment 630 to the other stable "0" state 615 as the voltage is relaxed to the ferroelectric capacitor.

Data in a ferroelectric memory cell is read by connecting a reference voltage to a first bit line, connecting the cell capacitor between a complimentary bit line and a plate line signal voltage, and interrogating the cell. There are several suitable techniques to interrogate an FRAM cell. Two suitable interrogation techniques that can be employed are step sensing and pulse sensing. In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage is typically supplied at an intermediate voltage between a voltage ($V_{"0"}$) associated with a capacitor programmed to a binary "0" 615 of FIG. 6, and that of the capacitor programmed to a binary "1" ($V_{"1"}$) 620 (e.g., an intermediate voltage of about ½ $V_{cc}$). The resulting differential voltage at the sense amp terminals represents the data stored in the cell, which is buffered and applied to a pair of local IO lines.

The transfer of data between the FRAM, the sense amp circuit, and the local data bit lines is controlled by various access transistors, typically MOS devices, with switching signals being provided by control circuitry in the device. In a typical ferroelectric memory read sequence, two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

FIG. 6 and the accompanying description are provided for illustrative purposes and are not intended to be a complete description of the operation of a ferroelectric capacitor, but merely to highlight some aspects of its operation. It is appreciated, that when a ferroelectric capacitor is contaminated by hydrogen diffusion, operation of the ferroelectric capacitor (e.g., the hysteresis loop) is altered and can render the device unusable. That is, the contaminated capacitor exhibits a degraded hysteresis loop or no longer exhibits hysteretic behavior due to the loss of polarization retention.

Figure 7:
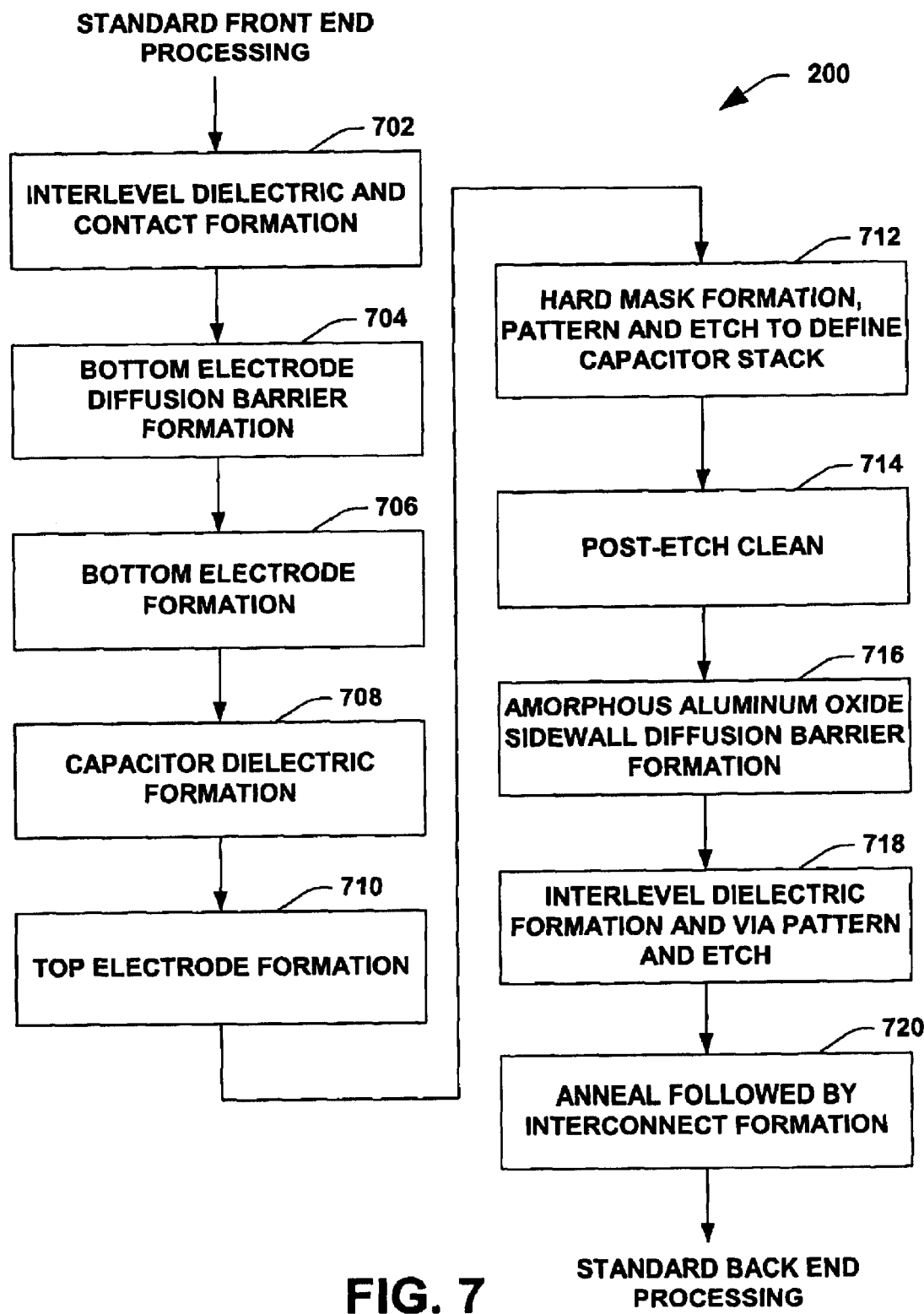
FIG. 7 is a flow diagram of a method of forming a semiconductor device having a ferroelectric capacitor in accordance with an aspect of the present invention.

Turning now to FIG. 7, a flow diagram illustrating a method 700 of forming a semiconductor device having a ferroelectric capacitor in accordance with an aspect of the present invention. The method 700 operates on a device that has undergone standard front end processing.

Beginning at block 702, an interlevel dielectric layer is formed and conductive contacts (e.g., tungsten (W) contacts) are formed therein with a barrier layer (e.g., TiN) disposed therebetween to avoid oxidation of the tungsten contacts. Formation of the interlayer dielectric and the contacts may be formed by various means and any such process is contemplated as falling within the scope of the present invention. Subsequently, the FRAM capacitor(s) are formed over the interlayer dielectric and the contacts.

A bottom electrode diffusion barrier layer is formed over the interlevel dielectric and the contact(s) at block 704. The bottom electrode diffusion layer is comprised of a suitable material and is formed so as to have a low resistivity. Some exemplary materials suitable for the bottom electrode diffusion barrier layer include, TiAlON, TaSiN, TiSiN, TaAlN, Ti, TiN, Ta, TaN, HfN, ZrN, HfAlN, CrN, TaAlN, CrAlN, and the like. A suitable deposition technique for the bottom electrode diffusion barrier layer include reactive sputter deposition using $Ar+N_2$ or $Ar+NH_3$. Other deposition techniques that might be used include CVD or plasma enhanced CVD.

It is appreciated that a cleaning operation can be performed prior to formation of the bottom electrode diffusion barrier layer. For example, one option is to sputter clean with Ar prior to the deposition of the bottom electrode diffusion barrier layer. This pre-clean occur without a vacuum break prior to the deposition of the barrier.

A bottom electrode is formed over the bottom electrode diffusion barrier layer at block 706. This layer should remain stable during subsequent processing and formation of the ferroelectric dielectric layer. For example, with a PZT ferroelectric, reliability is improved with oxide electrodes. The electrode experiences the thermal budget and oxidizing conditions of the ferroelectric deposition and possibly anneal. Therefore the bottom electrode is desirably stable in oxygen and does not form insulating layers as a result of such oxygen. It is also advantageous that the bottom electrode at least partially impedes the oxidation and reaction of the underlying diffusion barrier.

In addition, the bottom electrode preferably maintains a relatively low contact resistance. A list of possible materials includes Pt, Pd, PdOx, IrPt alloys, Au, Ru, $RuO_x$, (Ba,Sr,Pb)RuO3, (Sr,Ba,Pb)IrO3, Rh, $RhO_x$, $LaSrCoO_3$, (Ba,Sr)$RuO_3$, $LaNiO_3$.

The bottom electrode can be formed via a number of suitable techniques. For example, the bottom electrode can be formed by a putter deposition for Ir (Ar) and/or reactive sputter deposition ($Ar+O_2$) for $IrO_x$, which work well with PZT ferroelectric materials.

A ferroelectric dielectric layer is formed on the bottom electrode at block 708. The ferroelectric dielectric layer is comprised of a ferroelectric material such as $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3 etc. PZT is frequently chosen the capacitor dielectric because it has the highest polarization and the lowest processing temperature of the aforementioned materials. Thin PZT (<100 nm) is extremely advantageous in making integration more simple (less material to etch) and less expensive (less material to deposit therefore less precursor). Because PZT has the largest switched polarization, it is also possible to minimize capacitor area using such material.

The ferroelectric dielectric layer can be formed by a deposition process such as metal organic chemical vapor deposition (MOCVD). MOCVD is preferred especially for thin films (<100 nm). MOCVD also permits the film thickness to be scaled without significant degradation of switched polarization and coercive field, yielding PZT films with a low operating voltage and large polarization values. In addition, the reliability of the MOCVD PZT film is better than that generally obtained using other deposition techniques, particularly with respect to imprint/retention.

Continuing at block 710, a top electrode is formed over the ferroelectric dielectric layer. The top electrode can be comprised of one or more individual layers. The top electrode can be comprised of materials similar to those employed for the bottom electrode. Some suitable materials for the top electrode include, iridium oxide and iridium.

In particular it is advantageous for Pb based ferroelectrics to have a conductive oxide top electrode such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a noble metal in order to minimize degradation due to many opposite state write/read operations (fatigue). Many of the Bi ferroelectrics such as SBT can also use noble metal electrodes such as Pt, Pd, Au, Ag, Ir, Rh, and Ru and still retain good fatigue characteristics.

If the top electrode is an oxide, it is generally advantageous to have a noble metal layer above it in order to maintain low contact resistance between the top metal contact and oxide. For example, it is possible that a TiN in contact with IrOx might form TiO2 during subsequent thermal processes, which is insulating. For any electrode using an expensive noble metal such as Pt, Ru, Pd, or Ir it is advantageous from a cost and integration standpoint to use as thin of layer as possible. The top electrode can be formed via a variety of suitable deposition processes, such as a physical vapor deposition process.

At block 712, a hard mask is formed followed by a patterning process that defines a capacitor stack. The hard mask is comprised of a suitable material that is resistant to developer such as silicon dioxide or a silicon rich material and retains its integrity during the capacitor stack etch process. The hard mask is formed so as to be thick enough to facilitate patterning of the deposited layers to form the capacitor stack.

Continuing at block 714, a post patterning process is performed to remove unwanted remnants of the patterning process (e.g., developer, resist, and the like). The pattern and etch processes can introduce contaminants to the capacitor stack and the semiconductor device. After a patterning process, it is likely that the etch tool and the front side, edge and backside of the wafers will have FRAM contamination or have etch residues with FRAM contamination. It is therefore desirable to clean the front side of the wafer and chemically remove etch residues and possibly remove a thin layer of damaged PZT. This post capacitor etch wet clean can, with some etch conditions and chemistries, be as simple as a DI water clean (tank soak with or without megasonic followed by a spin rinse dry) or the tank etch might be acid based in order to improve the clean or remove more damage. One exemplary acid solution might be similar to SC1 or SC2 (possibly without peroxide but maybe with ozone), for example ($NH_4F+O_3+H_2O$ or $NH_4F+H_2O_2+HCl+H_2O$: 1/1/ 1/300) in order to also assist in particle removal plus metal contamination removal).

The backside and edges of the wafer can be significantly contaminated by re-deposition of FRAM elements. The contamination is preferably removed prior to process in a shared tool. One method to remove the backside chemistry is to use a specialized tool such as a backside clean tool (e.g., as made by SEZ). Even hard to etch materials such as Ir can be removed if they are sub monolayer coverage by undercutting the etching of the material on the backside. Other suitable solutions and/or methods can be employed to remove unwanted remnants of the patterning process and still be in accordance with the present invention.

A sidewall diffusion barrier layer is formed at block 716 that encapsulates the capacitor stack. The sidewall diffusion barrier layer is comprised of amorphous aluminum oxide and is formed via a physical vapor deposition process performed at a low temperature (e.g., less than 300° C.). The sidewall diffusion barrier layer formation process is generally performed at the low temperature and includes process parameters including temperature, power settings, oxygen flow, argon flow, pressure and the like. Suitable temperature ranges for the process include about 180–300° C. Such temperatures reduce the formation of crystalline features within the sidewall diffusion barrier layer (i.e., are more amorphous) and utilize a smaller portion of a thermal budget than similar barrier layers formed at higher temperatures. Generally, the lower the temperature the less crystalline features appear in the sidewall diffusion barrier layer. The pressure employed is a subatmospheric pressure of around a few milli torr.

To perform a sputter deposition procesess, which is an example of a suitable PVD process, an aluminum source, referred to as a target, and a wafer having the device is formed thereon is placed inside a vacuum chamber. Typically, the target is electrically grounded but can also be biased. In one example, oxygen gas is introduced into the chamber at a determined flow rate. Argon gas is also introduced into the chamber at a determined flow rate and is ionized to a positive charge. The positively charged argon ions are attracted to the grounded or otherwise biased aluminum target and accelerate toward it. During the acceleration, the argon ions gain momentum and strike the target. At the target, a phenomenon called momentum transfer takes place wherein the argon ions "knock off" aluminum ions from the target into the chamber. The sputtered aluminum ions react with the oxygen, also present in the chamber, and come to rest on the wafer and, thereby, the device thus forming the aluminum oxide sidewall diffusion barrier layer.

It is appreciated that other types of deposition procedures, such as chemical vapor deposition (CVD) can be employed to possibly generate an amorphous and/or partially amorphous sidewall diffusion barrier layer. However, such procedures require higher processing temperatures (e.g., >300° C.) and thus consume more of a thermal budget for a given semiconductor device. Further, such procedures can still fail to selectively yield an appropriate sidewall diffusion barrier layer.

At block 718, an interlevel dielectric layer is deposited and/or formed over the device and vias are formed in the interlevel dielectric layer to provide electrical connections to the top electrode and other contacts. The interlevel dielectric layer is comprised of a suitable materials, such as, $SiO_2$, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The interlevel dielectric layer can then be planarized (e.g., chemical mechanical planarization).

After the interlevel dielectric layer is formed, vias are formed to make electrical connection to the top electrode and to the contacts. Standard semiconductor processing techniques can be utilized to form the vias. The vias are formed without etching a significant amount of the underlying material (W, TiN and $SiO_2$ at the contacts) and hard mask etch stop layer (TiAlON or TiON) on top of the capacitors under a few preferred embodiments. SiN etch processes with these characteristics have been developed and the etch selectivity to TiAlON has been documented to be very good. This result is useful since the SiN etch rate on the capacitor is expected to faster and the SiN is also expected to be thinner compared to at the contacts which is deeper.

An anneal process is performed followed by interconnect formation at block 720 so as to remove damage introduced by the capacitor stack processing (such as the ferroelectric material etch, encapsulation, and contact etch) into the capacitor dielectric and to improve the electrical properties of these features. If this anneal is not done at this point (i.e. if the anneal is done with the PZT stack exposed on its sidewalls), then it may result in the loss of Pb near the perimeter of each capacitor. This loss in Pb in the PZT film will result in the degradation of the electrical properties of small capacitors (capacitors with large perimeter to area ratios) after the capacitor integration.

The anneal of the instant invention is, generally, performed after the interlevel dielectric is formed and the via holes patterned and etched, but prior to the filling of the vias with the conductive material. After this anneal is performed, the via diffusion barrier (liner) and conductor are formed using standard semiconductor processing techniques. The conductor is either W with TiN diffusion barrier or more preferably Cu with TaN, TaSiN, Ta, TiN, WN, or TiSiN diffusion barrier deposited by enhanced sputter deposition or more preferably CVD. The Cu is deposited by first depositing a Cu seed by enhanced sputter deposition or CVD preferably followed by Cu electroplating in order to fill the via. A standard semiconductor processing approach after the deposition of the metal in the via is to remove the metal on the top surface by etch back (W) or CMP (W and Cu). Another alternative is that metal layer above the via is formed using dual damascene process along with the via. The disadvantage of this approach results is a substantial increase in process complexity.

Standard back end processing can then be performed to complete fabrication of the semiconductor device.

It is appreciated that variations of the method 700 are contemplated and included in the present invention. For example, variations in process procedures, etching, depositing, and the like can occur and still be in accordance with the present invention.

Figure 8:
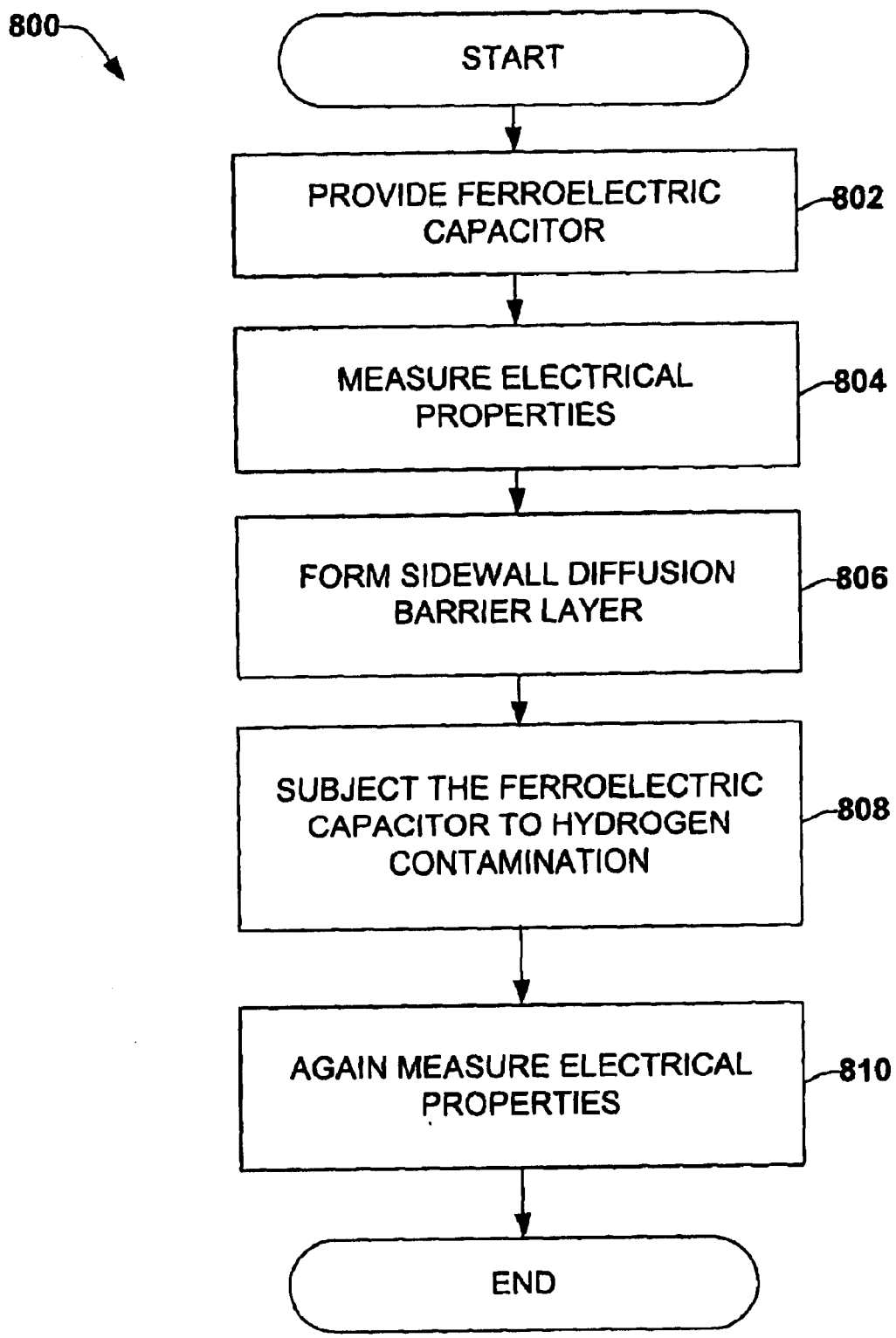
FIG. 8 is a flow diagram of a method of identifying diffusion characteristics of a sidewall diffusion barrier layer in accordance with an aspect of the present invention.

Turning now to FIG. 8, a flow diagram of a method 800 of identifying diffusion characteristics of a sidewall barrier layer in accordance with an aspect of the present invention is illustrated. The method 800 obtains the diffusion characteristics by identifying electrical properties of a ferroelectric capacitor, protected by the sidewall diffusion barrier layer, before and after subjecting the ferroelectric capacitor to a hydrogen contamination source.

Beginning at block 802, a ferroelectric capacitor stack is provided. The ferroelectric capacitor stack is formed over/on a substrate. The ferroelectric capacitor stack can be formed as described supra or in another suitable fabrication procedure. The ferroelectric capacitor stack can be formed on a test wafer, test die, or located in scribe line areas.

Electrical properties of the ferroelectric capacitor stack are measured and/or evaluated at block 804. The electrical properties measured include voltage, current, charge, polarization retention and the like. Suitable equipment is employed to obtain the electrical measurements, such as a probe machine with the capability of positioning needle like probes on devices and a switch box that selectively applies selected voltages. The probes can contact top and bottom electrodes of the ferroelectric capacitor stack and/or other contacts and structures associated with the ferroelectric capacitor stack, such as bond pads on the die.

Continuing at block 806, the sidewall diffusion barrier layer is formed on the ferroelectric capacitor stack so as to encapsulate the ferroelectric capacitor stack. The sidewall diffusion barrier layer is formed by a physical vapor deposition process, typically a sputter deposition process. This sidewall diffusion barrier layer formation process is generally performed at a low temperature and includes process parameters including temperature, power settings, oxygen flow, argon flow, pressure and the like. Suitable temperature ranges for the process include about 180–300° C. Such temperatures reduce the formation of crystalline features within the sidewall diffusion barrier layer (i.e., are more amorphous) than similar barrier layers formed at higher temperatures. Generally, the lower the temperature the less crystalline features appear in the sidewall diffusion barrier layer. The pressure employed is a low atmospheric pressure of around a few milli torr.

Subsequent to formation of the sidewall diffusion barrier layer, the ferroelectric capacitor stack is subjected to a hydrogen source as contamination at block 808. Without protection against the hydrogen, the ferroelectric capacitor stack becomes severely damaged. However, the sidewall diffusion barrier layer mitigates diffusion of hydrogen into the ferroelectric capacitor stack. At block 810, the sidewall diffusion barrier layer is removed and electrical properties of the ferroelectric capacitor stack are once again obtained and/or evaluated. This second set of electrical properties are compared with the first set of electrical properties (prior to being subjected to the hydrogen) to determine diffusion mitigation characteristics for the sidewall diffusion barrier layer. The diffusion mitigation characteristics correspond to the process parameters selected in forming the sidewall diffusion barrier layer and the characteristics of the sidewall diffusion barrier layer (e.g., thickness, amorphousness, crystalline features, and the like). The crystalline features can be identified via a transmission electron microscope (TEM), for example.

Figure 9:
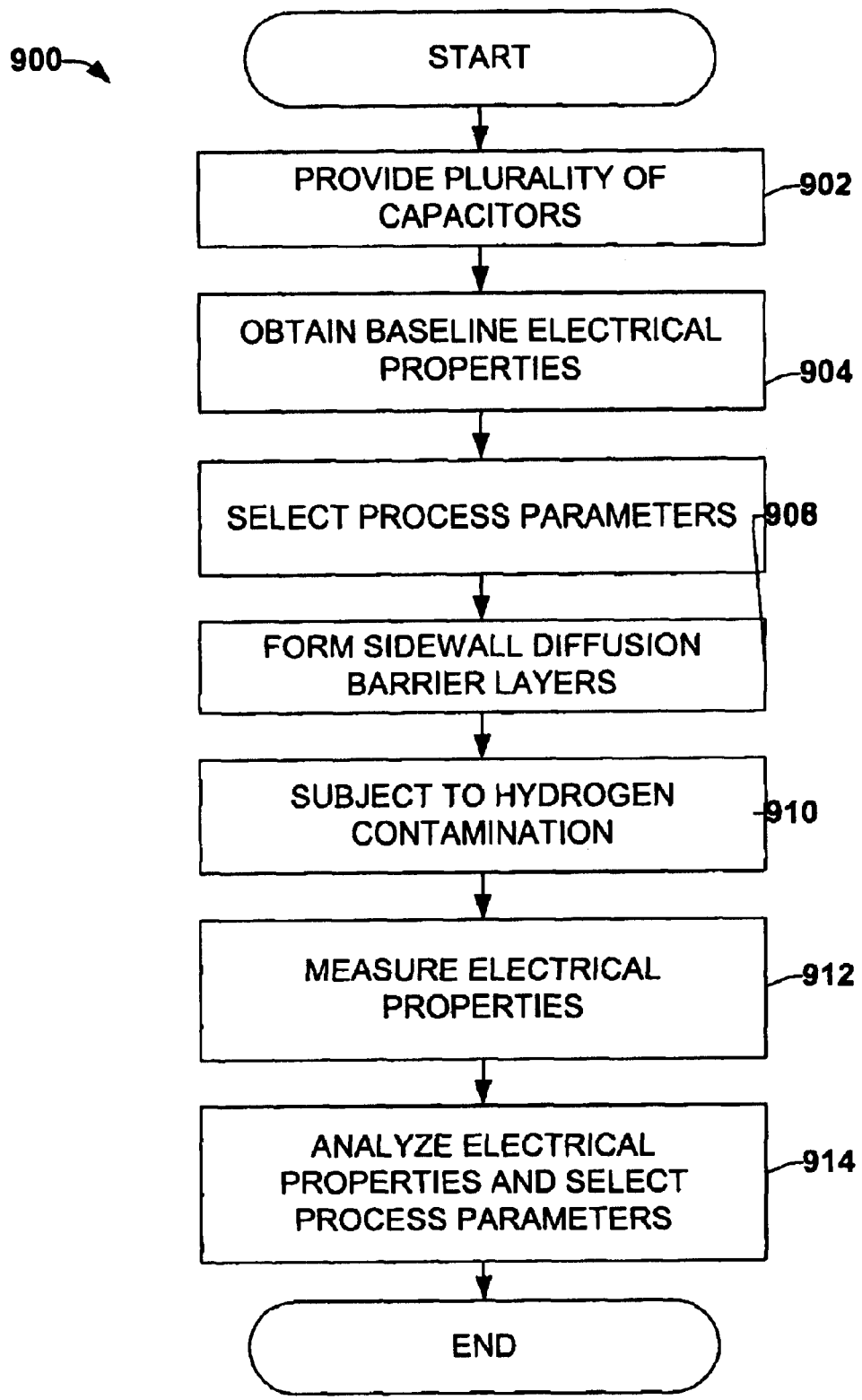
FIG. 9 is a flow diagram of a method of selecting process parameters for forming a sidewall diffusion barrier layer in accordance with an aspect of the present invention.

FIG. 9 is a flow diagram of a method 900 of selecting process parameters for forming a sidewall diffusion barrier layer in accordance with an aspect of the present invention.

A plurality of ferroelectric capacitors are provided at block 902. The capacitors can respectively be located on separate test dies and/or test wafers. Electrical properties of each of the plurality of ferroelectric capacitors are obtained and/or evaluated at block 904 to establish a baseline. According to one aspect of the invention, the ferroelectric capacitors are programmed with a program voltage of about 2 volts and then the data is read therefrom to obtain at least some of the electrical properties. A plurality of process parameters are selected at block 906 for generating sidewall diffusion barriers for the plurality of ferroelectric capacitors. The plurality of process parameters are typically varied so as to produce varied sidewall diffusion barrier layers (e.g., varied thickness, amorphousness, and the like). The process parameters include temperature, power settings, oxygen flow, argon flow, pressure and the like.

A plurality of differing sidewall diffusion barrier layers are formed on/over the plurality of ferroelectric capacitors at block 908, respectively, according to the plurality of process parameters. Subsequent to the formation of the plurality of sidewall diffusion barrier layers, the plurality of ferroelectric capacitors are subjected to hydrogen as a contamination source at block 910 according to a flow rate and/or amount of hydrogen. Generally, the hydrogen contamination simulates possible amounts that a typical ferroelectric capacitor will undergo in subsequent processing. Additionally, contamination parameters (flow rate, amount of hydrogen) can be modified for various implementations or uses. An annealing process (e.g., $H_2$) can optionally be performed at this point.

Continuing at block 912, the electrical properties of the plurality of ferroelectric capacitors, subsequent to hydrogen contamination are obtained and/or evaluated. The electrical properties are analyzed at block 914 and compared with the baseline results in order to determine acceptable process parameter(s) of the plurality of process parameters that yielded suitable results, and in some instances an optimal barrier and associated process for fabrication thereof is selected. It is appreciated that acceptability of the process parameters can vary for different implementations. It is also appreciated that, according to some aspects of the present invention, the generated plurality of sidewall diffusion barrier layers are removed in order to obtain the electrical properties.

Figure 10:
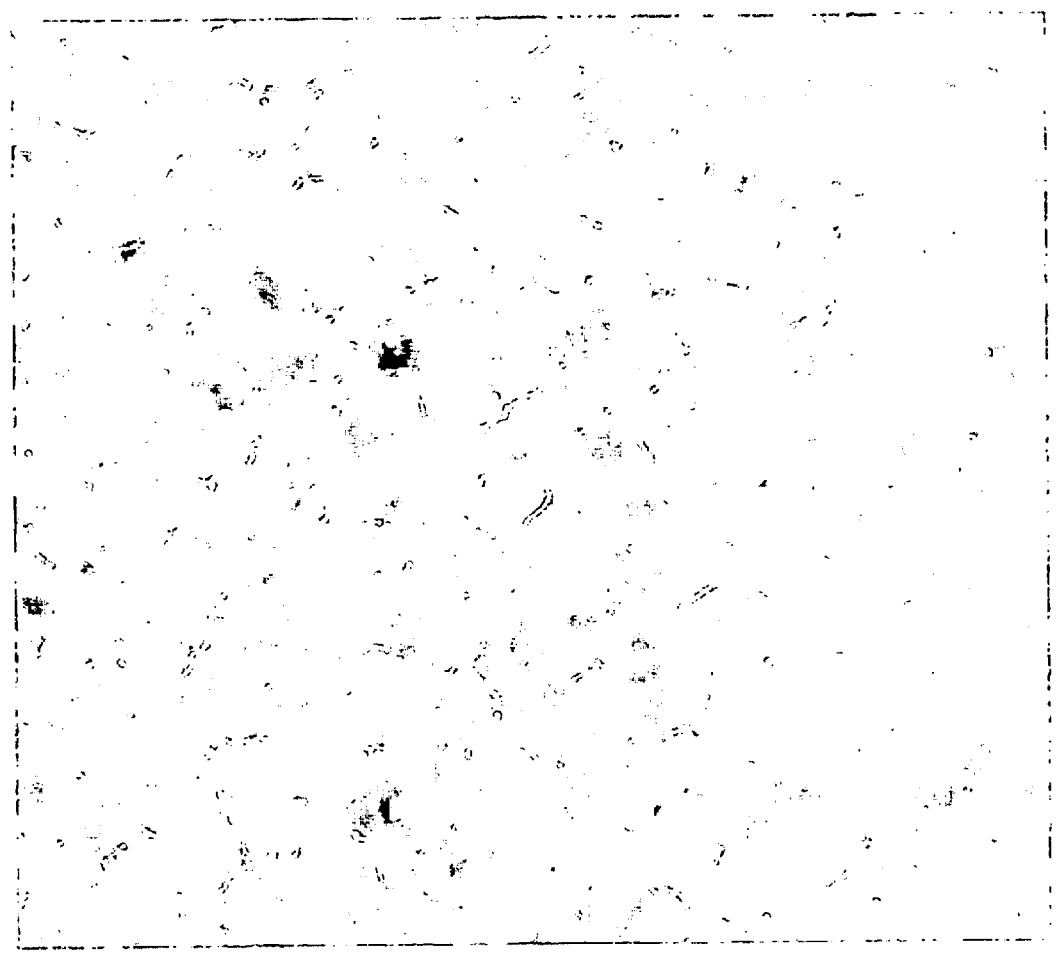
FIG. 10 is an image of a crystalline aluminum oxide sidewall barrier layer obtained via a transmission electron microscope.

FIG. 10 is an image of a crystalline or polycrystalline aluminum oxide sidewall barrier layer 1000. The crystalline aluminum oxide sidewall barrier layer was formed via a physical vapor deposition process, such as sputtering, at a temperature of 400° C. The image was obtained via a transmission electron microscope (TEM), and crystalline features are seen. The crystalline or polycrystalline aluminum oxide sidewall barrier layer is inferior at blocking or mitigating diffusion of hydrogen contamination in comparison to amorphous aluminum oxide sidewall barrier layer formed in accordance with the present invention.

Figure 11:
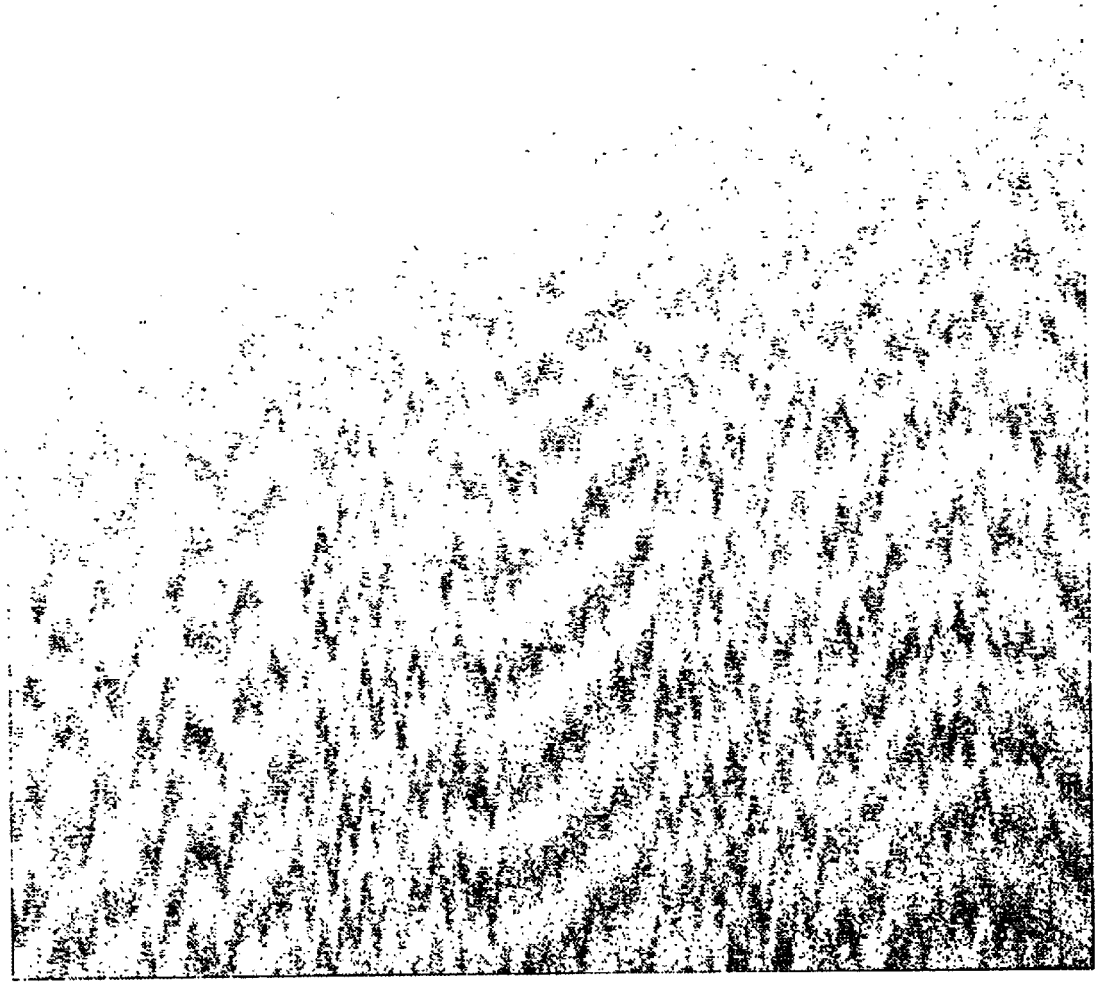
FIG. 11 is an image of an amorphous aluminum oxide sidewall barrier layer obtained via a transmission electron microscope.

FIG. 11 is an image of an amorphous aluminum oxide sidewall barrier layer 1100. The amorphous aluminum oxide sidewall barrier layer 1100 was formed via a physical vapor deposition process, such as sputtering, at a temperature of 180° C. Again, the image was obtained via a transmission electron microscope (TEM). Unlike FIG. 10, crystalline features cannot be identified in FIG. 11. The amorphous aluminum oxide sidewall barrier layer is superior to the crystalline aluminum oxide sidewall barrier layer 1000 in preventing or mitigating diffusion of hydrogen contamination into a ferroelectric capacitor. Particularly, it has been found that ferroelectric capacitors exhibit improved polarization retention with amorphous aluminum oxide barriers by providing improved protection compared to crystalline and/or polycrystalline type barriers.

Figure 12:
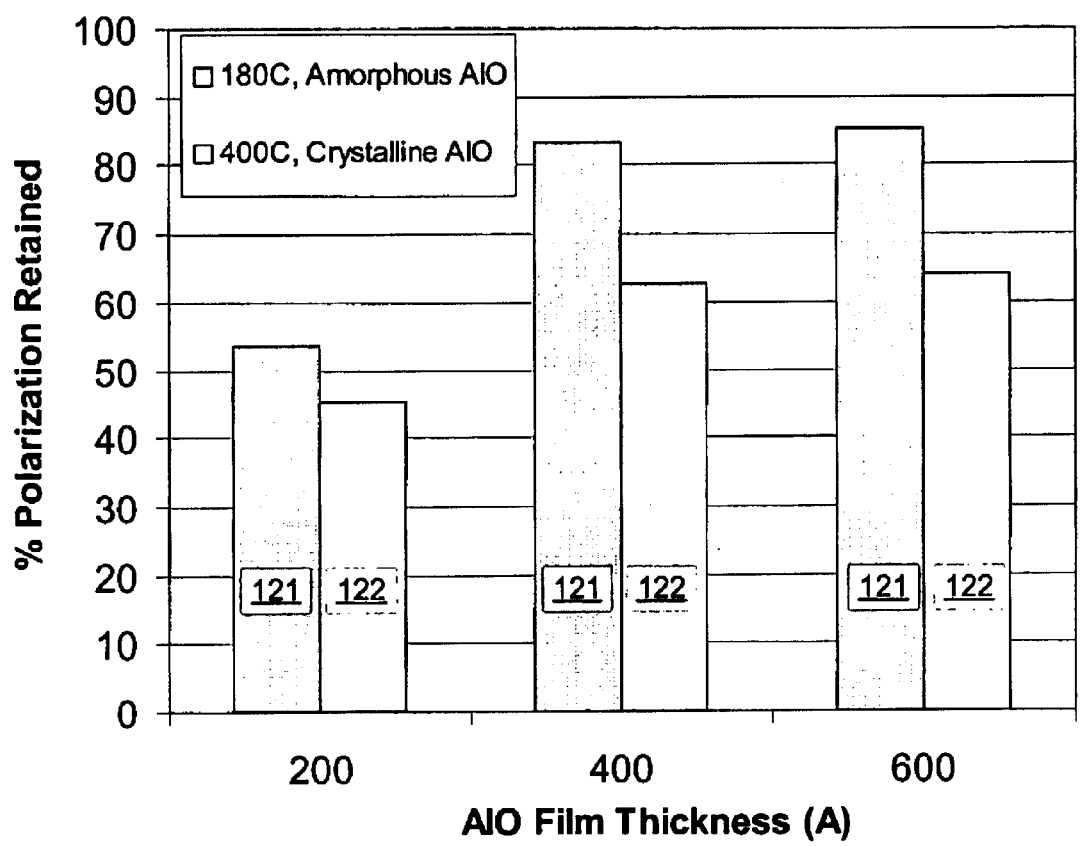
FIG. 12 is a graph illustrating polarization retention for various sidewall diffusion barrier layers.

FIG. 12 is a graph illustrating measured polarization retention. The y-axis indicates percentage of polarization retained after being subjected to hydrogen contamination, such as is described with respect to FIGS. 8 and 9. The x-axis depicts thickness of an amorphous aluminum oxide sidewall barrier layer 121 and a crystalline aluminum oxide sidewall barrier layer 122. The amorphous aluminum oxide sidewall barrier layer 121 is formed via a physical vapor deposition process at a temperature of about 180° C. The crystalline aluminum oxide sidewall barrier layer 122 is formed via a physical vapor deposition process at a temperature of about 400° C.

It is appreciated that the amorphous aluminum oxide sidewall barrier layer 121 in each case of differing barrier thicknesses in FIG. 12 provides superior polarization retention than the crystalline aluminum oxide sidewall barrier layer 122.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A ferroelectric device comprising:
    a ferroelectric capacitor comprising:
        a bottom electrode;
        a ferroelectric layer formed on the bottom electrode;
        a top electrode formed on the ferroelectric layer; and
    a sidewall diffusion barrier layer formed at least on sidewalls of the ferroelectric capacitor, the sidewall diffusion barrier layer being comprised of amorphous aluminum oxide formed via a physical vapor deposition process.

2. The device of claim 1, wherein the sidewall diffusion barrier layer is formed at a low temperature.

3. The device of claim 2, wherein the low temperature is less than about 300° C.

4. The device of claim 2, wherein the low temperature is about 180° C.

5. The device of claim 1, wherein the sidewall diffusion barrier layer fully encapsulates the ferroelectric capacitor.

6. The device of claim 1, wherein the sidewall diffusion barrier layer has less than a predetermined number of crystalline features identifiable via a transmission electron microscope.

7. The device of claim 1, wherein the sidewall diffusion barrier layer substantially mitigates hydrogen contamination of the ferroelectric.

8. The device of claim 1, wherein the ferroelectric layer is comprised of $Pb(Zr,Ti)O_3$ (PZT).

9. The device of claim 1, wherein the sidewall diffusion barrier layer is about 200 Angstroms thick.

10. The device of claim 1, wherein the sidewall diffusion barrier layer is greater than about 400 Angstroms thick.

11. A ferroelectric device comprising:
    a ferroelectric capacitor comprising:
        a bottom electrode;
        a ferroelectric layer formed on the bottom electrode;
        a top electrode formed on the ferroelectric layer; and
    a sidewall diffusion barrier layer formed at least on sidewalls of the ferroelectric capacitor, the sidewall diffusion barrier layer being comprised of amorphous aluminum oxide.

12. The device of claim 11, wherein the sidewall diffusion barrier layer fully encapsulates the ferroelectric capacitor.

13. The device of claim 11, wherein the sidewall diffusion barrier layer has less than a predetermined number of crystalline features identifiable via a transmission electron microscope.

14. The device of claim 11, wherein the sidewall diffusion barrier layer substantially mitigates hydrogen contamination of the ferroelectric.

15. The device of claim 11, wherein the ferroelectric layer is comprised of $Pb(Zr,Ti)O_3$ (PZT).

16. The device of claim 11, wherein the sidewall diffusion barrier layer is about 200 Angstroms thick.

17. The device of claim 11, wherein the sidewall diffusion barrier layer is greater than about 400 Angstroms thick.

* * * * *